United States Patent
Anc et al.

(10) Patent No.: US 11,670,740 B2
(45) Date of Patent: Jun. 6, 2023

(54) CONVERSION LAYER, LIGHT EMITTING DEVICE AND METHOD OF PRODUCING A CONVERSION LAYER

(71) Applicant: OSRAM Opto Semiconductors GmbH, Regensburg (DE)

(72) Inventors: Maria J. Anc, Groveland, MA (US); Juanita N. Kurtin, Hillsboro, OR (US); Joseph Treadway, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 36 days.

(21) Appl. No.: 16/584,495

(22) Filed: Sep. 26, 2019

(65) Prior Publication Data

US 2021/0098655 A1    Apr. 1, 2021

(51) Int. Cl.
*H01L 33/50* (2010.01)
*G02B 5/22* (2006.01)
*H01L 33/00* (2010.01)

(52) U.S. Cl.
CPC .............. *H01L 33/502* (2013.01); *G02B 5/22* (2013.01); *H01L 33/005* (2013.01)

(58) Field of Classification Search
CPC ... H01L 33/502; H01L 33/005; H01L 33/504; H01L 2933/0041; G02B 5/22; C09K 11/07; C09K 11/025
See application file for complete search history.

(56) References Cited

U.S. PATENT DOCUMENTS

| | | | |
|---|---|---|---|
| 8,491,815 B1 | 7/2013 | DiMaio | |
| 2007/0122722 A1* | 5/2007 | Kim | G02B 5/22 430/7 |
| 2010/0084629 A1* | 4/2010 | Park | H01S 5/10 257/13 |
| 2010/0113813 A1 | 5/2010 | Pickett et al. | |
| 2010/0276638 A1 | 11/2010 | Liu et al. | |
| 2014/0008685 A1* | 1/2014 | Basin | H01L 33/50 438/27 |
| 2015/0362165 A1* | 12/2015 | Chu | H01L 27/156 362/235 |
| 2016/0017099 A1 | 1/2016 | Furuta | |
| 2017/0152438 A1* | 6/2017 | Torres Cano | C08G 83/001 |
| 2017/0153382 A1* | 6/2017 | Wang | C09K 11/025 |
| 2018/0079953 A1* | 3/2018 | Shin | C09K 11/703 |

(Continued)

FOREIGN PATENT DOCUMENTS

| | | |
|---|---|---|
| WO | 2007106770 A2 | 9/2007 |
| WO | 2010040074 A2 | 4/2010 |
| WO | 2019059308 A1 | 3/2019 |

OTHER PUBLICATIONS https://www.chemicalbook.com/ChemicalProductProperty_EN_CB1767153.htm.*

(Continued)

*Primary Examiner* — Su C Kim
(74) *Attorney, Agent, or Firm* — Slater Matsil, LLP

(57) ABSTRACT

A conversion layer, a light emitting device and a method for producing a conversion layer are disclosed. In an embodiment a conversion layer includes light-converting nanocrystals, an encapsulation surrounding the light-converting nanocrystals and ligands bonded to a surface of the encapsulation, wherein encapsulated light-converting nanocrystals are crosslinked by the ligands.

20 Claims, 4 Drawing Sheets

(56) References Cited

U.S. PATENT DOCUMENTS

| | | | |
|---|---|---|---|
| 2018/0122869 A1* | 5/2018 | Jiang | H01L 51/502 |
| 2019/0115507 A1* | 4/2019 | Kim | H01L 33/28 |
| 2020/0264461 A1 | 8/2020 | Kuwana et al. | |
| 2021/0013381 A1 | 1/2021 | Mangum et al. | |

OTHER PUBLICATIONS https://www.chemicalbook.com/ChemicalProductProperty_EN_CB8467281.htm.*

"Basics of Microstructuring," MicroChemicals, downloaded from www.microchemicals.com/downloads/application_notes html on May 16, 2019, 16 pages.

"i-Line Photoresist Advanced i-Line Materials," Shipley, downloaded from https://www.seas.upenn.edu/~nanosop/documents/SPR_220_Data_Sheet.pdf on Sep. 26, 2019, 4 pages.

"Microposit S1800 Series Photo Resists," Shipley, downloaded from http://www.nanophys.kth.se/nanophys/facilities/nfl/resists/S1813/s1800seriesDataSheet.pdf on Sep. 26, 2019, 6 pages.

"SU-8 2000 Permanent Epoxy Negative Photoresist Processing Guidelines for: SU-8 2000.5, SU-8 2002, SU-8 2005, SU-8 2007, SU-8 2010 and SU-8 2015," MicroChem, downloaded from www.microchem.com on May 16, 2019, 5 pages.

"Photoresists AZ and MicroChemicals TI resists," Photoresists, Ancillaries, Etchants, Solvents and Technical Support for all Stages of MicroStructuring and Lithography, MicroChemicals, downloaded from https://www.microchemicals.com/products/photoresists.html on Jan. 21, 2019, 4 pages.

"Resists, Developers and Removers," MicroChemicals, Revised Nov. 17, 2013, Source: www.microchemicals.com/downloads/application_notes.html, downloaded on May 16, 2019, 6 pages.

Sugita, H. et al., "I-line Photoresist composed of multifunctional acrylate, photo initiator, and photo acid generator, which can be patterned after g-line photo-crosslinking," Elsevier, Microelectronic Engineering, vol. 195, 2018, 9 pages.

Virey, J., "Status of the microLED Industry," Yole Developpement, Phosphor Global Summit 2019, Quantum Dots Forum 2019, La Jolla, Tuesday, Mar. 19, 2019, 33 pages.

Virey, J., "Emerging Display Technologies and Impact for Downconverters," Yole Developpement, Phosphor Global Summit 2019, Quantum Dots Forum 2019, La Jolla, Mar. 20, 2019, 38 pages.

Wang, Y. et al., "Direct Optical Lithography of Functional Inorganic Nanomaterials," Science, vol. 357, Jul. 28, 2017, 5 pages.

* cited by examiner

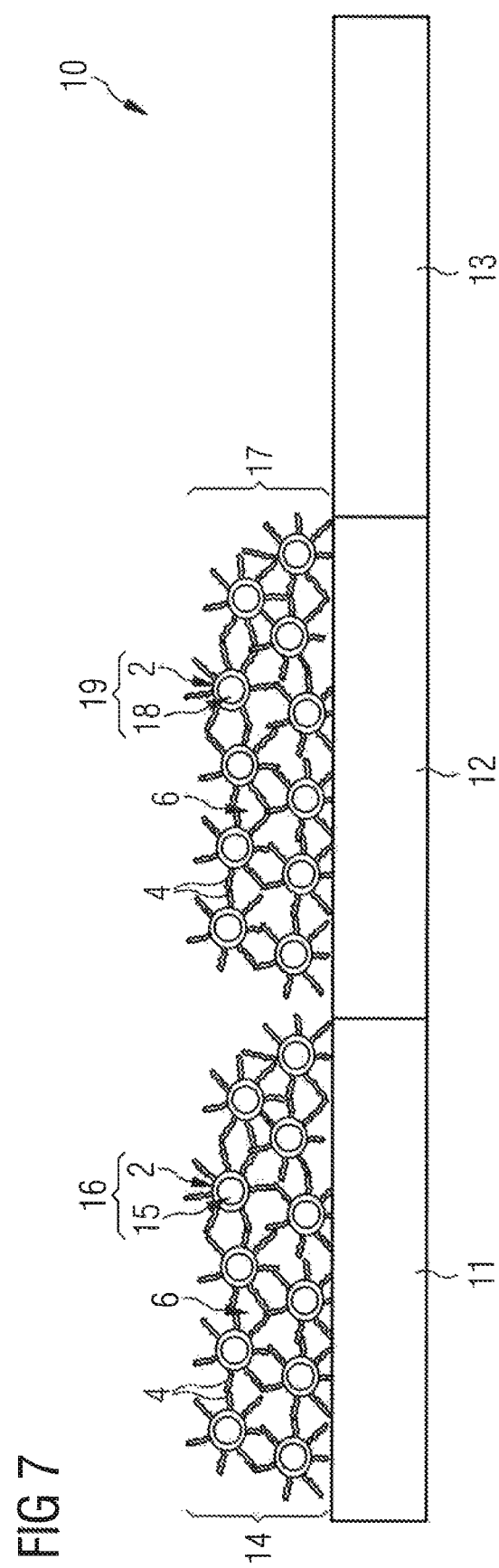

CONVERSION LAYER, LIGHT EMITTING DEVICE AND METHOD OF PRODUCING A CONVERSION LAYER

TECHNICAL FIELD

The invention relates to a conversion layer, in particular configured to convert light. It further relates to a light-emitting device and a method of producing a conversion layer.

SUMMARY

Embodiments provide a thin conversion layer with high conversion efficiency, in particular with high absorption and high conversion efficiency. Further embodiments provide a light-emitting device with at least one thin conversion layer with a high conversion efficiency. Yet other embodiments provide a method of producing a thin conversion layer with a high conversion efficiency.

Embodiments provide a thin conversion layer with a high conversion efficiency. Further embodiments provide a light-emitting device with at least one thin conversion layer with a high conversion efficiency. Yet further embodiments provide a method of producing a thin conversion layer with a high conversion efficiency.

According to at least one embodiment, a conversion layer is provided comprising light-converting nanocrystals. In particular, the light-converting nanocrystals may be used as a conversion material for converting the wavelength of a primary radiation which passes through at least part of the conversion material. Light-converting nanocrystals are nanoparticles, for example, semiconductor nanoparticles or quantum dots.

Here and in the following, "light conversion" means that primary radiation of a first wavelength range is converted in secondary radiation of a second wavelength range which comprises preferably longer wavelengths than the primary radiation. In general, wavelength converting phosphors absorb primary radiation, convert the absorbed radiation at least partially, preferably completely, in secondary radiation of a second wavelength range by a molecular and/or atomic mechanism and reemit the converted radiation. In particular, scattering or absorption alone is not meant by wavelength conversion in this context.

Nanoparticles are small objects with dimensions in the nanometer range that can have different properties than bulk material of the same composition. In particular, nanoparticles have at least one dimension smaller than 100 nm. Nanocrystals are nanoparticles with a mostly crystalline structure. For example, nanocrystals are composed of atoms in a single- or polycrystalline arrangement.

According to at least one embodiment, the conversion layer comprises an encapsulation surrounding the light-converting nanocrystals. In particular, the encapsulation is provided to protect the light-converting nanocrystals from degradation and/or to stabilize the light-converting nanocrystals against agglomeration. The light-converting nanocrystals are at least partially, preferably completely, surrounded by the encapsulation. The light-converting nanocrystals can be surrounded by the encapsulation from all sides. The encapsulation envelops the light-converting nanocrystal in a regular or irregular manner. In particular, the encapsulation follows at least partially, preferably completely, the form and/or shape of the light-converting nanocrystals. In other words, the encapsulation preferably envelops the nanocrystals in a conformal manner. Furthermore, the light-converting nanocrystals can be in direct contact with the encapsulation material.

Each light-converting nanocrystal can be individually encapsulated, i.e., one light-converting nanocrystal comprises at least one layer of encapsulation material surrounding the one light-converting nanocrystal. Thus, each individual encapsulated light-converting nanocrystal has a finite size and is generally distinguishable from every other nanocrystal. An encapsulated light-converting nanocrystal has, for example, a diameter of 5 nm inclusive to 100 nm inclusive, in particular of 50 nm.

Alternatively or additionally, a multiplicity of nanocrystals can be encapsulated together, i.e., a plurality of light-converting nanocrystals comprises at least one layer of encapsulation material surrounding all of the light-converting nanocrystals of the plurality of light-converting nanocrystals. In particular, the plurality of nanocrystals comprises an average number of at least 120,000 nanocrystals. For example, the plurality of nanocrystals comprises an average number of 1,200,000 nanocrystals. In some instances, this number may be ten times larger or ten times smaller. The encapsulated plurality of light-converting nanocrystals has, for example, an extension of at most 1 µm in every dimension.

According to at least one embodiment, the conversion layer comprises ligands bonded to a surface of the encapsulation. In this context, ligands are nonconductive organic, inorganic or hybrid inorganic-organic molecules with at least two functional moieties. In other words, the ligands are bifunctional organic, inorganic or hybrid inorganic-organic molecules. In particular, the ligands are bifunctional organic or inorganic molecules. The ligands are grafted or bonded to the surface of the encapsulation of the light-converting nanocrystals with at least one functional moiety. Each encapsulated light-converting nanocrystal comprises at least one ligand bonded to the surface of its encapsulation. In particular, at least ten ligands are bonded to the surface of the encapsulation of each light-converting nanocrystal, preferably a few hundred to a few thousands of ligands. For instance, an encapsulated plurality of light-converting nanocrystals can comprise up to 1.5 million ligands. In particular, the ligands each comprise at least one reactive group capable of joining ligands together.

According to at least one embodiment, the encapsulated light-converting nanocrystals are crosslinked by the ligands. The ligand of an encapsulated light-converting nanocrystal can be joined with at least one ligand of at least one other encapsulated light-converting nanocrystal. Since each light-converting nanocrystal can comprise or comprises a large number of ligands, each light-converting nanocrystal is a potent crosslinking agent. In other words, a high degree of crosslinking is possible. The conversion layer can be a dense network of encapsulated light-converting nanocrystals and ligands. In particular, due to the high degree of crosslinking, the conversion layer is solid.

According to at least one embodiment, the conversion layer comprises —light-converting nanocrystals, —an encapsulation surrounding the light-converting nanocrystals, —ligands bonded to a surface of the encapsulation, wherein the encapsulated light-converting nanocrystals are crosslinked by the ligands.

Such a conversion layer can in particular be formed as a thin continuous film with robust, environmentally protected light-converting nanocrystals. Unlike conventional conversion layers with light-converting nanocrystals without an encapsulation, a conversion layer described here does not require very well-controlled dry and/or protective ambient conditions and can be functionally used without a tight casting or molding. In other words, the conversion layer described here does not have to be encapsulated. Additionally, the conversion layer eliminates the requirement for an excess of polymeric matrix material, allows the formation of a dense film of light-converting nanocrystals in a desired spatial design and eliminates cracking of the dry film. Thus, the conversion layer can overcome the limitations for conversion layers formed by microcontact printing or inkjet printing methods, where a conversion layer is formed by evaporation of a solvent or curing of a polymeric matrix.

According to at least one embodiment, the conversion layer is free of a matrix material. A matrix material is to be understood as a material in which particles are embedded and/or distributed. Particles are, for example, encapsulated nanoparticles and/or light-converting nanocrystals. In particular, the matrix material is any host material. A conversion layer free of a matrix material comprises only particles, in particular encapsulated nanoparticles and/or light-converting nanocrystals, preferably crosslinked by ligands. In particular, the conversion layer consists of particles, preferably nanoparticles and/or light-converting nanocrystals, and the ligands. A conversion layer that is free of a matrix material can be formed as a very thin continuous and crack-free film.

According to at least one embodiment, the conversion layer comprises voids between the encapsulated light-converting nanocrystals. Voids are to be understood as any gaps and/or interstices between the encapsulated light-converting nanocrystals. The voids can be spaces completely or at least partially surrounded by light-converting nanocrystals. The voids may be filled at least partially with the ambient atmosphere or a gas. In particular, the voids may contain ligands, preferably crosslinked ligands. In particular, the voids transmit and do not absorb the primary radiation. In other words, primary radiation passes through the voids without being absorbed and/or converted.

According to at least one embodiment, the encapsulation comprises a dielectric transparent oxide. In particular, the encapsulation consists of the dielectric transparent oxide. For example, suitable dielectric transparent oxides are silicon oxide, titanium oxide, zirconium oxide, aluminum oxide, magnesium oxide, hafnium oxide, barium oxide, bismuth oxide, tin oxide or mixed oxides. For example, the encapsulation comprises or consists of silicon oxide.

According to at least one embodiment, the conversion layer comprises nonabsorbing particles. Nonabsorbing particles can be used in the conversion layer for intentional scattering of the primary radiation and/or for changing the thermal conductivity and/or the refractive index. In particular, nonabsorbing particles do basically not absorb and/or convert the primary radiation. Preferably, nonabsorbing particles do not absorb and/or convert the primary and secondary radiation. "Basically not absorb" means that at most 5% of the visible part of the primary and/or secondary radiation are absorbed.

Nonabsorbing particles, in particular having a high thermal conductivity, can be selected from alumina, $TiO_2$, $ZrO_2$, $HfO_2$, AlN, BN, undoped YAG, and/or $BaSO_4$.

Nonabsorbing particles for intentional scattering of the primary radiation can, in particular, improve the light absorption in thin conversion layers by distributing the photons of the primary radiation in the conversion layer in such a way that the light-converting nanocrystals can absorb a maximum of the primary radiation.

This is in particular advantageous for conversion layers with encapsulated light-converting nanocrystals crosslinked by ligands, as the light-converting nanocrystals absorb a part of the primary radiation while part of the primary radiation passes through the ligands and the voids between the light-absorbing nanocrystals. Thus, it is possible that primary radiation leaks through at least a part of the conversion layer. Since nonabsorbing particles in the conversion layer can lead to better distribution and absorption of the primary radiation in the conversion layer, leakage of primary radiation through the conversion layer may be reduced. In addition, conversion layers comprising nonabsorbing particles can be thinner than conversion layers without nonabsorbing particles while providing a comparable conversion.

According to at least one embodiment, a proportion of nonabsorbing particles in the conversion layer is between and including 0.5 wt % to 5 wt %. For example, a concentration for alumina or $BaSO_4$ particles with diameters of between and including 0.4 μm and 0.6 μm in a conversion layer is between and including $1.5 \times 10^{10}/cm^3$ and $5 \times 10^{10}/cm^3$.

According to at least one embodiment, the nonabsorbing particles are distributed in the conversion layer. In other words, the nonabsorbing particles are distributed and/or embedded in the conversion layer as in a matrix material. In particular, the nonabsorbing particles are not directly bonded to the material of the conversion layer. For example, the nonabsorbing particles are located in voids between the crosslinked light-converting nanocrystals.

According to at least one embodiment, ligands are bonded to the surface of the nonabsorbing particles, and the light-converting nanocrystals and the nonabsorbing particles are crosslinked by the ligands. In particular, the ligands bonded to the surface of the nonabsorbing particles can be the same ligands as the ligands bonded to the surface of the encapsulated light-converting nanocrystals. Alternatively, the ligands bonded to the surface of the nonabsorbing particles can have different functional groups attaching to the surface of the nonabsorbing particles than the ligands bonded to the light-converting nanocrystals. The ligands are grafted or bonded to the surface of the nonabsorbing particles with at least one functional moiety. Each nonabsorbing particle comprises at least one ligand bonded to its surface. In particular, more than one ligand is bonded to the surface of the nonabsorbing particle.

The at least one ligand of a nonabsorbing particle can be joined with at least one ligand of another nonabsorbing particle and/or an encapsulated light-converting nanocrystal. The conversion layer can then be a dense network of encapsulated light-converting nanocrystals and nonabsorbing nanocrystals crosslinked by the ligands.

According to at least one embodiment, a scattering cross-section of the nonabsorbing particles decreases with increasing wavelength. The nonabsorbing particles thus have a greater scattering cross-section for blue light than for red light and/or green light. This is advantageous for distributing the photons of the blue primary radiation in the conversion layer for an increased absorption of the primary radiation, while, at the same time, decreasing the scattering of the converted secondary radiation.

According to at least one embodiment, the conversion layer is photostructurable. "Photostructurable" with regard to a layer means that the structure of a layer, in particular the conversion layer, may be modified by light. The structure of a layer refers to the internal structure of links and bonds within the layer. In particular, in a photostructurable layer, bonds can be formed or broken if the photostructurable layer is exposed to light. Thus, a photostructurable layer may comprise functional groups configured to interact with light. For example, the ligands bonded to the surface of the encapsulated light-converting nanocrystals provide the conversion layer with its photostructurable properties.

According to one embodiment, the ligands comprise an anchor group, a spacer group and a terminal group. The ligands are bifunctional organic or inorganic or hybrid organic-inorganic molecules. "Bifunctional" means that the ligands have two different functional moieties, in particular, the anchor group and the terminal group. The two functional moieties are separated by the spacer group.

The anchor group of the ligands can be used to attach or graft the ligand to the surface of the encapsulated light-converting nanocrystal and/or the nonabsorbing particle. In other words, the anchor group is designed to interact with the surface of the encapsulated light-converting nanocrystal and/or the nonabsorbing particle. The anchor group comprises at least one functional group that can bond to the surface of the encapsulated light-converting nanocrystal and/or the nonabsorbing particle. The functional group forms at least one bond to the surface of the encapsulated light-converting nanocrystal and/or the nonabsorbing particle. For example, the functional group forms one, two or three bonds to the surface of the encapsulated light-converting nanocrystal and/or the nonabsorbing particle.

The spacer group of the ligand can be used for separating the light-converting nanocrystals and/or the nonabsorbing particles to, for example, prevent agglomeration. In the case of encapsulated light-converting nanocrystals the spacer group can be as short as, for example, one methylene group since the encapsulation may be sufficient to prevent an agglomeration. Additionally, the length of the spacer group may depend on the synthesis of the ligand as well as the kinetics of the crosslinking reaction for controlling the reaction rate.

The terminal group of the ligand can be used to crosslink at least two ligands, in particular, of at least two separate encapsulated light-converting nanocrystals and/or nonabsorbing particles. In particular, the reaction to crosslink or join the at least two ligands may be an addition reaction, a condensation reaction or an addition-elimination reaction. The terminal group comprises at least one functional group. In particular, the terminal group may comprise one, two or three functional groups which each can react with a functional group of the terminal group of a different ligand.

The anchor group and the terminal group are bonded to the spacer group with covalent bonds, for example, ether or ester connections as well as carbon-carbon, silicon-carbon, sulfur-carbon, phosphorus-carbon, or nitrogen-carbon bonds.

According to at least one embodiment, the anchor group is bonded to the surface of the encapsulated light-converting nanocrystals and/or the nonabsorbing particles with covalent, dative or ionic bonds. In particular, the at least one functional group of the anchor group is bonded to the surface of the encapsulated light-converting nanocrystals and/or the nonabsorbing particles with at least one covalent, dative or ionic bond. For example, a functional group of the anchor group is bonded to the surface of an encapsulated light-converting nanocrystal and/or a nonabsorbing particle with one, two or three covalent bonds. Thus, the anchor group is strongly attached to the surface of the encapsulated light-absorbing nanocrystals and/or the nonabsorbing particles. For example, the anchor group is bonded to the surface of the encapsulated light-converting nanocrystals and/or the nonabsorbing particles with oxygen-boron, oxygen-silicon or oxygen-phosphorus covalent bonds with the boron atom, the silicon atom or the phosphorus atom being part of the functional group of the anchor group.

According to at least one embodiment, to form the covalent bond between the anchor group and the surface of the encapsulated light-converting nanocrystals and/or the non-absorbing particles, a catalyst is used. For example, the catalyst is an acid, a base, or a metal catalyst. With a catalyst, for example, a phospho-ester or a silicon-ether connection to the surface of the encapsulated light-converting nanocrystals and/or the nonabsorbing particles is formed.

According to at least one embodiment, the anchor group comprises Si and is covalently bonded to the surface of the encapsulated light-converting nanocrystals. For example, the anchor group comprises silyl halide or siloxy groups. If, in particular, the encapsulation of the light-converting nanocrystals comprises or consists of silica, the anchor group comprising Si is covalently bonded to the silica encapsulation with a silicon-oxygen-silicon bond.

According to at least one embodiment, the anchor group is covalently bonded to the surface of the encapsulated light-converting nanocrystal and/or the nonabsorbing particle and comprises electrically charged functionalities. In particular, the covalent bonding of the ligands to the surface of the encapsulated light-converting nanocrystals and/or the nonabsorbing particles creates an electrically charged functionality known to strongly interact with partners of opposite charge that can be connected to the spacer group. In other words, an electrostatically driven association is used to bond the anchor group to the surface of the encapsulated light-converting nanocrystals and/or the nonabsorbing particles.

According to at least one embodiment, the spacer group is an organic radical. The spacer group can be a linear or branched alkyl radical, a linear or branched alkenyl radical, a linear or branched alkynyl radical, an aryl radical, a cyclo-alkyl radical, a dextran radical, a norbornyl radical, an ester, an ether or a combination thereof. For example, the spacer group is a linear alkyl chain comprising a number n of $CH_2$ groups. The number n can be selected from between and including 1 and 20.

According to at least one embodiment, the terminal group comprises photosensitive functional groups. Photosensitive functional groups may be chosen from reactive subunits of common photoresist precursors. If exposed to light of a suitable wavelength range, a photosensitive functional group of a first ligand may react with a photosensitive functional group of a second ligand and form at least one covalent bond between the first ligand and the second ligand. In particular, the first ligand is a ligand of a first encapsulated light-converting nanocrystal or nonabsorbing particle and the second ligand is a ligand of a second encapsulated light-converting nanocrystal or nonabsorbing particle, thus linking the first encapsulated light-converting nanocrystal or nonabsorbing particle and the second encapsulated light-converting nanocrystal or nonabsorbing particle via both ligands.

Alternatively, crosslinked ligands can be solubilized if exposed to light of a suitable wavelength range. In other words, the bond between the two ligands can be broken. In particular, small molecules can be removed from the crosslinked ligands, thus separating the ligands. For example, an acid is photo-generated in a vicinity of the particles so that the acid might hydrolyze connections such as esters between ligands.

According to at least one embodiment, the terminal group comprises at least an allyl group, an epoxy group or a derivative thereof.

An allyl group is an unsaturated hydrocarbon radical with the general formula $H_2C=CH-CH_2-R$, with, in this case, R as the spacer group of the ligand. In other words, an allyl group is a 2-propenyl group, a vinyl group bonded to a methylene group. Allyl groups are very convenient subunits of common photoresist precursors capable of reacting with other allyl-based photoresist precursors. Allyl groups can thus be used to crosslink ligands.

An epoxy group is a reactive organic group comprising a three-ring made of two carbon atoms and one oxygen atom. Epoxy groups can react with other epoxy groups via a ring opening mechanism. This reaction can be facilitated by a catalyst, such as an acid, a base, or a photo-radical source like triarylsulfonium or diaryldiazonium salts. Alternatively a hardener can be added such as an amine, a diamine, or olefins. Epoxy groups can thus be used to crosslink ligands.

Both for the allyl group and for the epoxy group, the carbon atoms can be substituted with hydrogen atoms or organic radicals, for example, alkyl, alkenyl, or aryl radicals.

According to at least one embodiment, the terminal group comprises at least an epoxy group.

According to at least one embodiment, the terminal group comprises at least an acrylate group or a methacrylate group. Acrylate and methacrylate groups are derivatives of allyl groups. Acrylate and methacrylate groups can thus be used to crosslink ligands. An acrylate group has the general formula $CH_2=CH-COOR$. An methacrylate group has the general formula $CH_2=C(CH_3)-COOR$. In both cases, R may be the spacer group of the ligand. Acrylate or methacrylate groups may easily be bonded to spacer groups through an esterification.

According to one embodiment, the ligand comprises an anchor group comprising Si and a terminal group comprising at least an allyl group, an epoxy group, an acrylate group or a methacrylate group.

According to one embodiment, the ligand has the following structure:

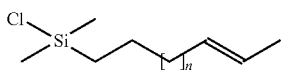

(I)

According to at least one embodiment, the ligand has the following structure:

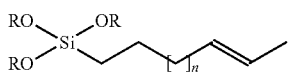

(II)

According to at least one embodiment, the ligand has the following structure:

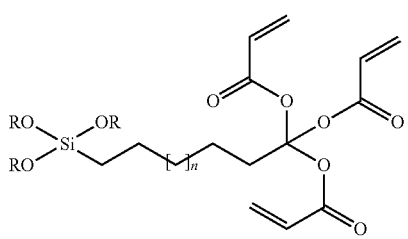

(III)

According to at least one embodiment, the ligand has the following structure:

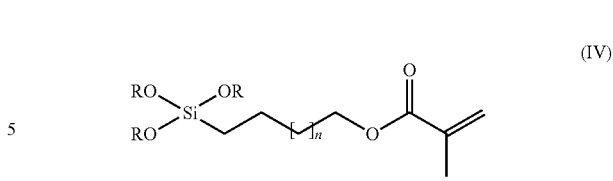

(IV)

According to at least one embodiment, the ligand has the following structure:

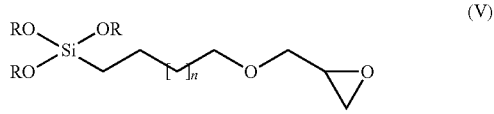

(V)

According to at least one embodiment, the ligand has the following structure:

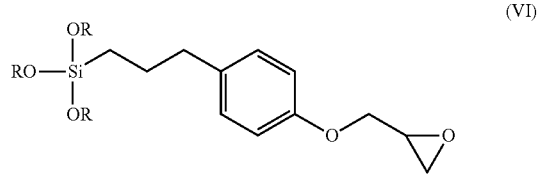

(VI)

Another aspect relates to a light-emitting device comprising at least one conversion layer described above. Features and embodiments of the conversion layer are also disclosed for the light-emitting device and vice versa.

According to at least one embodiment, the light-emitting device comprises a plurality of emitters each configured to emit electromagnetic radiation of a first wavelength range, wherein at least some of the emitters are covered with a conversion layer described above, wherein the conversion layer is configured to convert electromagnetic radiation of a first wavelength range into electromagnetic radiation of a second wavelength range.

Each emitter can be a light-emitting diode or part of a light-emitting diode structured into at least three individual parts. The emitter is, for example, a semiconductor chip or a part of a pixelated semiconductor chip. The emitters are operable independently from each other. In particular, each emitter emits radiation of a first wavelength range, a primary radiation, preferably in the UV wavelength range or in the blue wavelength range.

The individual emitters can be arranged within the light-emitting diode without restriction to a specific order. In other words, each emitter can be arranged adjacent to any other emitter in any two-dimensional geometric order. In particular, at least one edge of an emitter is arranged adjacently to an edge of another emitter within the light-emitting device.

The emitters may have an edge length of at most 100 µm, in particular of at most 10 µm, preferably of at most 5 µm, particularly preferably of at most 1 µm. The edge length refers to an extension of the emitter in a main extension direction of the emitter. The emitters may have any form or shape. In particular, the emitters may be rectangular, square, triangular or circular. In particular, for square emitters, each edge may have the same length.

The features of the conversion layer have already been disclosed in conjunction with the conversion layer and also apply to the conversion layer in the light-emitting device.

The conversion layer converts the primary radiation completely or at least partially into electromagnetic radiation of a second wavelength range, a secondary radiation. In particular, the secondary radiation has at least partially different wavelength ranges than the primary radiation.

Such a light-emitting device can be used as a display device or as a part of a display device for emitting white light or colored light. In particular, the light-emitting device can be formed as a pixel or a subpixel of a display. The light-emitting device described here can comprise particularly small emitters without requiring pre-formed cavities or confinement walls between the individual emitters for separating the individual conversion layers. Instead, the conversion layers can be arranged as thin, densely packed, and crack-free films without additional matrix material in a desired spatial design.

Although pre-formed cavities or confinement walls are not necessarily required to separate the individual emitters, for some applications superior devices might result by creating arrays with pre-formed cavities or confinement walls between the individual emitters to reduce cross-talk between the individual light-emitting devices.

According to at least one embodiment, at least some of the emitters are covered with at least a first or a second conversion layer, wherein the at least first or second conversion layer differs in the light-converting nanocrystals and/or the ligands. In other words, some emitters may be covered with a first conversion layer and some emitters may be covered with a second conversion layer. In particular, the emitters not covered with either the first or the second conversion layer may remain free of a conversion layer or may be covered with a further conversion layer, for example, a third conversion layer.

The different conversion layers may comprise different light-converting nanocrystals.

For example, the first conversion layer comprises first light-converting nanocrystals. The first light-converting nanocrystals can be used for converting the wavelength of the primary radiation into a secondary radiation of a second wavelength range. The first light-converting nanocrystals can be green light-converting nanocrystals. Green light-converting nanocrystals can be used for converting the wavelength of a primary radiation into a secondary radiation in the green wavelength range.

For example, the second conversion layer comprises second light-converting nanocrystals. The second light-converting nanocrystals can be used for converting the wavelength of the primary radiation into a secondary radiation of a third wavelength range. In particular, the second light-converting nanocrystals can be red light-converting nanocrystals. Red light-converting nanocrystals can be used for converting the wavelength of a primary radiation into a secondary radiation in the red wavelength range.

"Free of a conversion layer" means that no conversion layer, in particular no light-converting nanocrystals, is arranged on an emitter. Thus, an emitter free of a conversion layer is configured to emit primary radiation. In particular, the third emitter emits primary radiation in the blue wavelength range.

For example, a third conversion layer comprises third light-converting nanocrystals. The third light-converting nanocrystals can be used for converting the wavelength of the primary radiation into a secondary radiation of a fourth wavelength range. In particular, the third light-converting nanocrystals can be blue light-converting nanocrystals. Blue light-converting nanocrystals can be used for converting the wavelength of a primary radiation into a secondary radiation in the blue wavelength range.

According to one embodiment, each emitter is covered with a conversion layer. In particular, each emitter is covered with either a first or a second or a third conversion layer. For instance, the emitters emit a primary radiation in the UV wavelength range that is converted into green radiation by the first conversion layer, red radiation by the second conversion layer and blue radiation by the third conversion layer. The light-emitting device then emits white mixed light. Alternatively, each emitter can be covered with the same conversion layer. The light-emitting device then emits colored light.

According to at least one embodiment, the light-emitting device comprises—at least three emitters, —a first conversion layer applied to a first emitter of said emitters, wherein the first conversion layer is configured to convert radiation of the first wavelength range into radiation of a second wavelength range, —a second conversion layer applied to a second emitter of said emitters, wherein the second conversion layer is configured to convert radiation of the first wavelength range into radiation of a third wavelength range, wherein a third emitter of said emitters is free of a conversion layer or a third conversion layer is applied to a third emitter of said emitters, wherein the third conversion layer is configured to convert radiation of the first wavelength range into radiation of a fourth wavelength range.

In particular, the emitters emit a primary radiation in the blue wavelength range that is converted into green radiation by the first conversion layer and red radiation by the second conversion layer. In combination with the blue primary radiation emitted by the emitter free of a conversion layer, the light-emitting device emits white mixed light.

In particular, the emitters emit a primary radiation in the UV wavelength range that is converted into green radiation by the first conversion layer, red radiation by the second conversion layer and blue radiation by the third conversion layer. Thus, the light-emitting device emits white mixed light.

Another aspect relates to a method of producing a conversion layer on a substrate. The method described here is preferably used to produce the conversion layer described here for a light-emitting device described here. Features and embodiments of the method are therefore also disclosed for the conversion layer and the light-emitting device and vice versa.

According to at least one embodiment, the method of producing a conversion layer on a substrate comprises providing a substrate. In this context, a substrate is to be understood as an LED wafer or any other relatively rigid material, for example, a plastic foil such as mylar, a silicon wafer, a III-V compound wafer, a glass wafer or a slide or the like. In particular, the substrate is free of pre-formed cavities or confinement walls.

According to at least one embodiment, the method comprises applying an initial layer to the substrate, wherein the initial layer is photostructurable and comprises light-converting nanocrystals comprising an encapsulation and ligands bonded to the surface of the encapsulation. In particular, the precursor is applied to the entire surface of the substrate. In other words, the surface of the substrate is coated or covered with the initial layer.

The light-converting nanocrystals, their encapsulation and the ligands have been described above in conjunction with the conversion layer. All embodiments and features described above for the conversion layer also apply to the method for producing a conversion layer.

According to at least one embodiment, the method comprises selectively exposing the initial layer to radiation to generate a pattern of exposed and unexposed areas of the initial layer. In particular, radiation of a specific wavelength range may be used. For geometries in the micrometer or sub-micrometer range, radiation with a wavelength of 435 nm or less can be used. For example, Hg lamps with their spectral lines at 435 nm ("g-line"), 405 nm ("h-line") or 365 nm ("i-line") can be used. For defined features with dimensions in the order of 100 nm and/or less than 100 nm, lasers, for example, excimer lasers with shorter wavelengths such as a krypton fluoride laser with a wavelength of 248 nm or an argon fluoride laser with a wavelength of 193 nm are used.

According to at least one embodiment, the method comprises removing either the exposed or the unexposed areas of the initial layer. The exposed or the unexposed areas of the initial layer can be removed by selective etching methods.

According to at least one embodiment, the method of producing a conversion layer on a substrate comprises—providing a substrate, —applying an initial layer to the substrate, wherein the initial layer is photostructurable and comprises light-converting nanocrystals comprising an encapsulation and ligands bonded to the surface of the encapsulation, —selectively exposing the initial layer to radiation to generate a pattern of exposed and unexposed areas of the initial layer, —removing either the exposed or the unexposed areas of the initial layer.

The method steps for producing a conversion layer on a substrate described here are not restricted to this order. According to a preferred embodiment, however, they are carried out in this order.

With such a method, a thin, densely packed, and crack-free conversion layer can be produced on a substrate. In contrast to conventionally used inkjet printing, the method described here does not require pre-formed cavities or confinement walls to contain the amount of precursor material needed for full conversion and to prevent spreading and intermixing of the precursors.

According to at least one embodiment, the substrate comprises at least one light-emitting diode, in particular an array of light-emitting diodes. In particular, the at least one light-emitting diode is pixelated into individual parts or is formed of a multiplicity of individual light-emitting diodes. In particular, the individual parts of the light-emitting diode or the individual light-emitting diodes of the multiplicity of light-emitting diodes are not separated by, for example, pre-formed cavities or confinement walls.

According to at least one embodiment, a mask for generating the pattern of exposed and unexposed areas is aligned on the initial layer prior to selectively exposing the initial layer to radiation, wherein the mask is removed after selectively exposing the initial layer to radiation. The mask can be a photo-mask made of a piece of glass or quartz coated with a chromium film, which is patterned, i.e., some areas are etched. Thus, the mask comprises transparent and dark areas forming a pattern. The pattern of the transparent and dark areas can correlate to the pattern of exposed and unexposed areas generated on the initial layer upon exposing the initial layer to radiation. In particular, transparent areas of the mask correlate with exposed areas of the initial layer and dark areas of the mask correlate with unexposed areas of the initial layer. In particular, the bonds within the conversion layer are only formed or broken in the exposed areas of the initial layer that are not covered by the mask.

The mask may be in direct mechanical contact with the initial layer. Alternatively, the mask and the initial layer may be spaced apart.

Aligning the mask and exposing the initial layer to radiation can be performed with special equipment. The mask can be removed by a robotic element.

According to at least one embodiment, the initial layer is selectively exposed to radiation using a laser. For example, an excimer laser such as a krypton fluoride laser with a wavelength of 248 nm or an argon fluoride laser with a wavelength of 193 nm can be used. In particular, areas of the initial layer can be selectively exposed without using a mask. In other words, each process step of the method of producing a conversion layer on a substrate is free of a mask or maskless. For example, the areas of the initial layer are exposed to radiation by direct writing. For direct writing, the radiation of the laser is focused to a narrow beam that is scanned in vector form across the initial layer. The beam is then used to directly write the pattern of exposed areas onto the initial layer. For example, areas with defined features with dimensions in the order of 100 nm and/or less than 100 nm can be exposed to radiation. In other words, the forming or breaking of bonds within the conversion layer can be localized to the local vicinity of the light-converting nanocrystals in the conversion layer. Thus, no mask may be required to achieve a desired spatial design.

According to at least one embodiment, ligands in the initial layer are crosslinked during selectively exposing the initial layer to radiation. Exposing the initial layer to radiation starts or initiates the crosslinking reaction in the exposed areas. In particular, the radiation triggers the crosslinking reactions between the individual ligands.

After exposure, the exposed areas of the initial layer can comprise crosslinked ligands. The initial layer on the unexposed areas comprising ligands that are not crosslinked can be removed from the substrate. Thus, the conversion layer is present on the exposed areas and the unexposed areas are free or mostly free of the conversion layer.

According to at least one embodiment, crosslinked ligands are solubilized during selectively exposing the initial layer to radiation. In other words, bonds between crosslinked ligands in the initial layer are broken if exposed to radiation. In particular, small molecules are removed from the crosslinked ligands. After exposure, the exposed areas of the initial layer can comprise solubilized or de-crosslinked ligands that can be removed from the substrate. Thus, the conversion layer is present on the unexposed areas and the exposed areas are free or mostly free of the conversion layer.

BRIEF DESCRIPTION OF THE DRAWINGS

Advantageous embodiments and developments of the conversion layer, the light-emitting device, and the method of producing a light-emitting device will become apparent from the exemplary embodiments described below in conjunction with the figures.

In the figures:

FIG. 7 shows a schematic illustration of a light-emitting device according to one embodiment.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
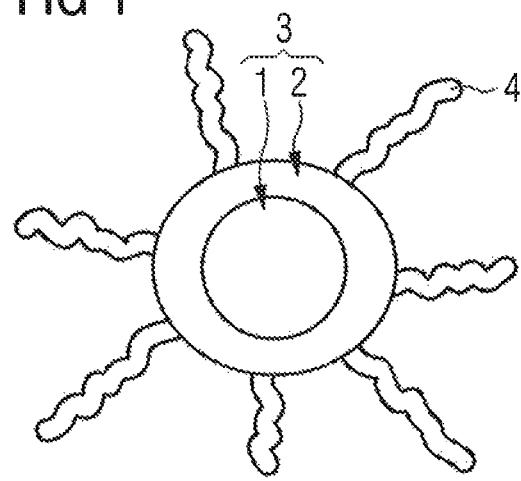
FIG. 1 shows a schematic illustration of an encapsulated light-converting nanocrystal with ligands according to one embodiment.

FIG. 1 shows a light-converting nanocrystal 1. The light-converting nanocrystal 1 may be a semiconductor nanoparticle or a quantum dot. The light-converting nanocrystal 1 is encapsulated by an encapsulation 2 surrounding the light-converting nanocrystal 1 at least partially, preferably completely. In particular, the encapsulation 2 comprises a transparent dielectric oxide, preferably silicon oxide. A light-converting nanocrystal 1 surrounded by the encapsulation 2 is an encapsulated light-converting nanocrystal 3. Ligands 4 are grafted or bonded onto the surface of the encapsulation 2 of the light-converting nanocrystal 1. In other words, the ligands 4 are grafted or bonded onto the encapsulated light-converting nanocrystal 3.

Figure 2A:
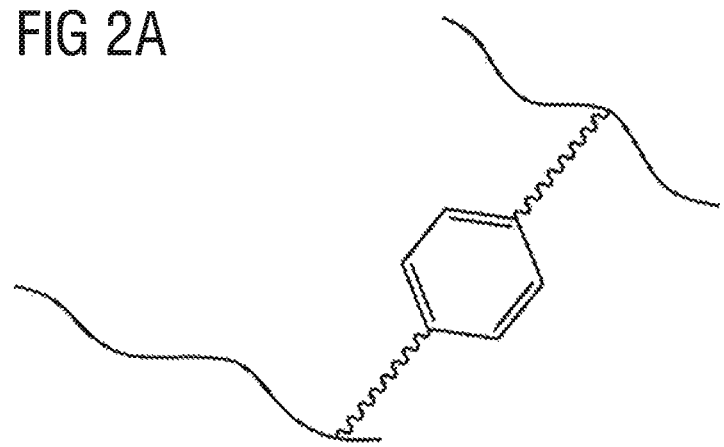
FIG. 2A shows a comparative example and FIG. 2B shows an embodiment of a crosslinker.
Figure 2B:
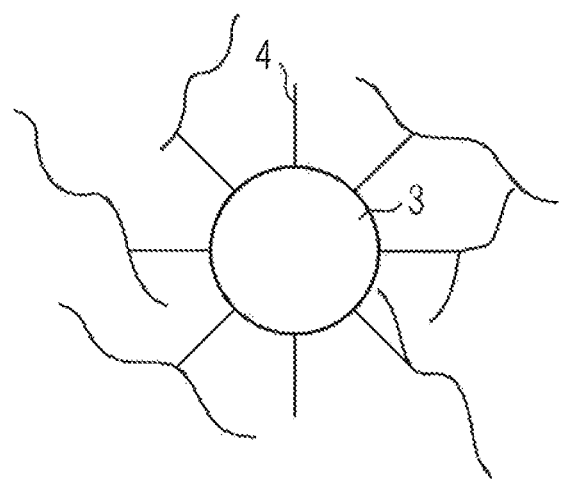

FIG. 2A shows a comparative example of a typical organic crosslinker connecting two moieties. FIG. 2B shows an encapsulated light-converting nanocrystal 3 with a plurality of ligands 4 bonded to its surface and connecting a plurality of moieties. In other words, an encapsulated light-converting nanocrystal 3 with ligands 4 has a higher crosslinking potential or capacity than the typical organic crosslinker since an encapsulated light-converting nanocrystal 3 can comprise more than two ligands 4 and each ligand 4 has the capacity of connecting to at least one moiety.

It should be noted that the high crosslinking potential is not limited to encapsulated light-converting nanocrystals 3. In particular, any nanoparticle or nanocrystal capable of bonding ligands 4 to its surface may be designed to have a high crosslinking potential.

Figure 3A:
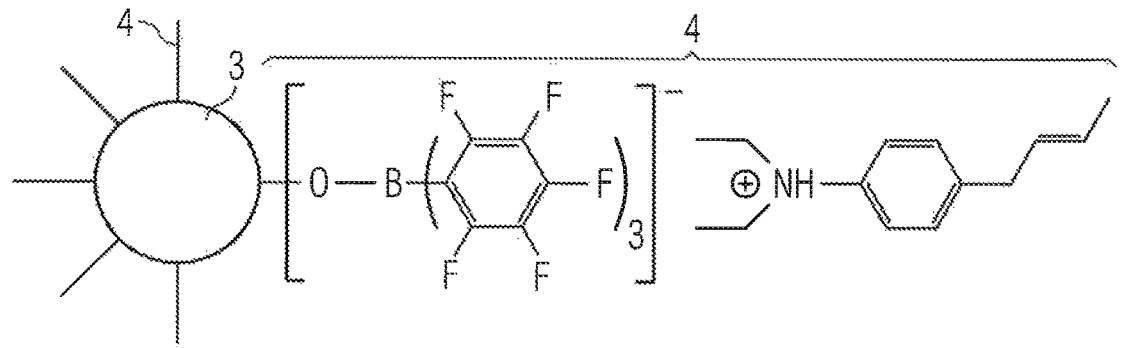
FIGS. 3A-3D show illustrations of the bonding of anchor groups according to different embodiments.
Figure 3B:
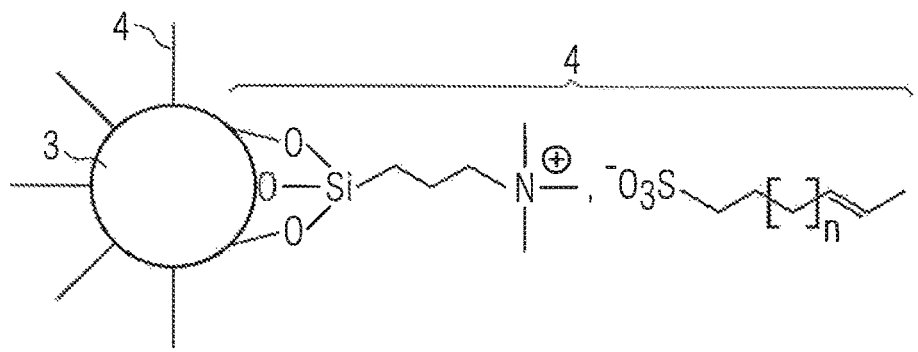
Figure 3C:
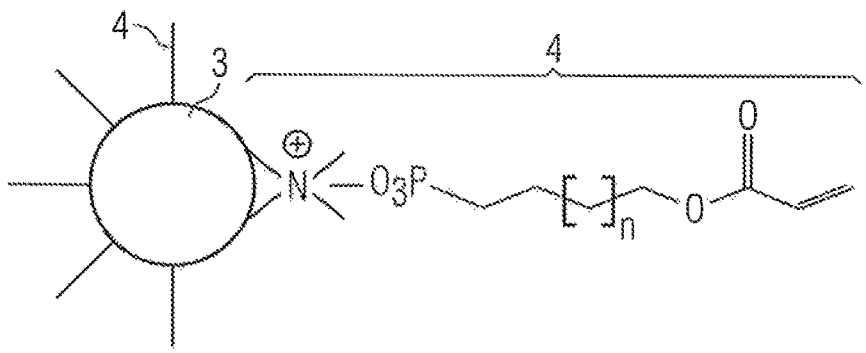
Figure 3D:
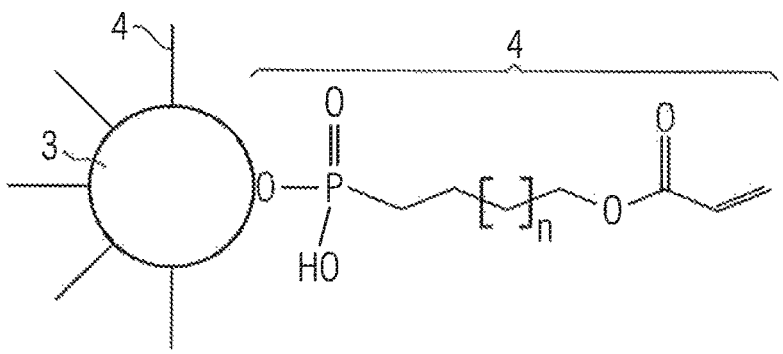

FIGS. 3A-D show a subset of binding motives of ligands 4 to the surface of encapsulated light-converting nanocrystals 3. In FIGS. 3A-C, covalent or dative bonding of the anchor group of the ligand 4 to the surface of the encapsulated light-converting nanocrystal 3 creates an electrically charged functionality known to strongly interact with partners of opposite charge. In other words, an electrostatically driven association is used to bond the ligand 4 to the surface of the encapsulated light-converting nanocrystal 3. FIG. 3D shows a different use of the same versatile linker as shown in FIG. 3C. In FIG. 3D, acid-, base-, or metal-catalyzed chemistry has been employed to form a phospho-ester connection to the surface of the encapsulated light-converting nanocrystal 3.

In FIG. 3A, the ligand 4 is a tris(pentafluoroaryl)borate anilinium salt.

In FIG. 3B, the ligand 4 is a siloxyalkyl-trialkyl-ammonium alkylsulfonate salt. In particular, many variants of this ligand exist and the ligand 4 might generally be selected from tri-oxysilylalkyl groups, for example, tri-oxysilylpropylmethacrylate.

In FIG. 3C, the ligand 4 is a tetra-alkylammonium alkyl phosphonate salt.

In FIG. 3D, the ligand 4 is an alkylphosphonate or an alkylphosphonyl ester depending on the binding type of the ligand 4 to the encapsulated light-converting nanocrystal 3.

It should be noted that these binding motives are also applicable to bonding the ligands 4 to the surface of other nanoparticles, for example, nonabsorbing particles.

Figure 4:
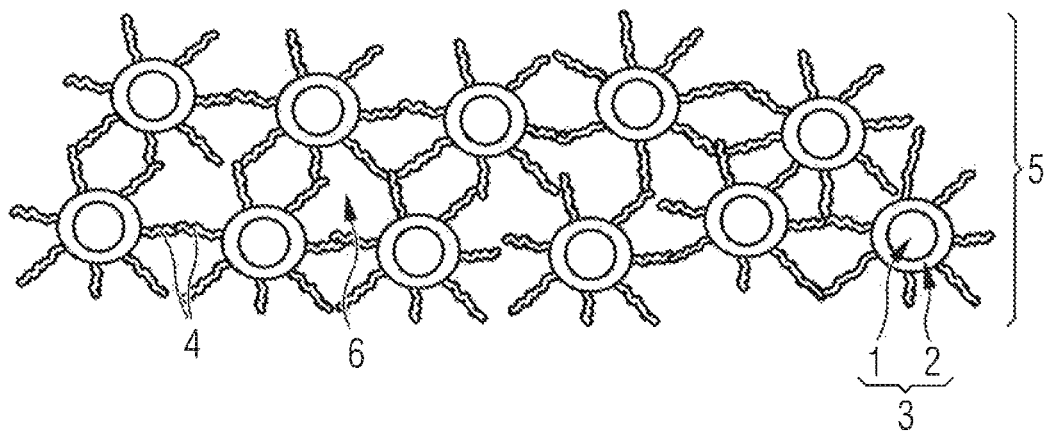
FIG. 4 shows a schematic illustration of a conversion layer according to one embodiment.

FIG. 4 shows a schematic illustration of a conversion layer 5 comprising light-converting nanocrystals 1 with an encapsulation 2. Ligands 4 are bonded to the surface of the encapsulated light-converting nanocrystals 3. The encapsulated light-converting nanocrystals 3 are crosslinked by the ligands 4. The ligand 4 of an encapsulated light-converting nanocrystal 3 can be joined with at least one ligand 4 of at least one other encapsulated light-converting nanocrystal 3. In particular, two ligands 4 are joined together with at least one covalent bond. Since each encapsulated light-converting nanocrystal 3 can comprise a large number of ligands 4, each encapsulated light-converting nanocrystal 3 is a potent crosslinking agent. In particular, two encapsulated light-converting nanocrystals 3 are connected with at least one, two or three linked ligands 4. The conversion layer 5 comprises a dense network of encapsulated light-converting nanocrystals 3 and ligands 4 and, thus, a high degree of crosslinking. In particular, due to the high degree of crosslinking, the conversion layer 5 is solid.

Between the cross-linked encapsulated light-converting nanocrystals 3 voids 6 are formed. The voids 6 may comprise the ambient atmosphere and/or the ligands 4. In particular, the voids 6 do not basically absorb and/or convert the primary radiation.

Figure 5:
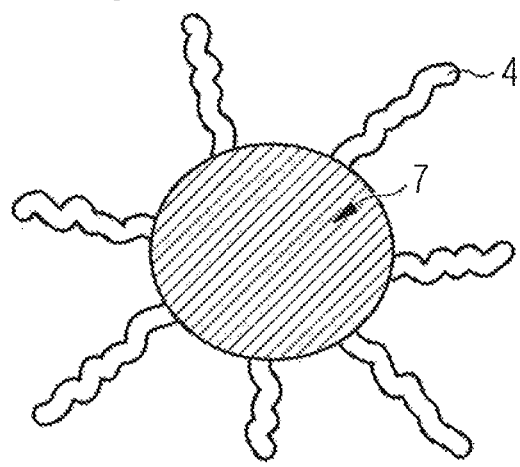
FIG. 5 shows a schematic illustration of a nonabsorbing particle with ligands according to one embodiment.

FIG. 5 shows a nonabsorbing particle 7. Ligands 4 are grafted or bonded onto the surface of the nonabsorbing particle 7. The anchor group of the ligands 4 bonded to the surface of the nonabsorbing particle 7 can be specific to the elemental composition of the nonabsorbing particle. Thus, the anchor group of the ligands 4 bonded to the surface of the nonabsorbing particle 7 can be the same as, or different than the anchor group of the ligands 4 bonded to encapsulated light-converting nanocrystals 3. In particular, the ligands 4 bonded to the surface of the nonabsorbing particle 7 can be the same ligands 4 as the ligands 4 bonded to encapsulated light-converting nanocrystals 3.

Figure 6:
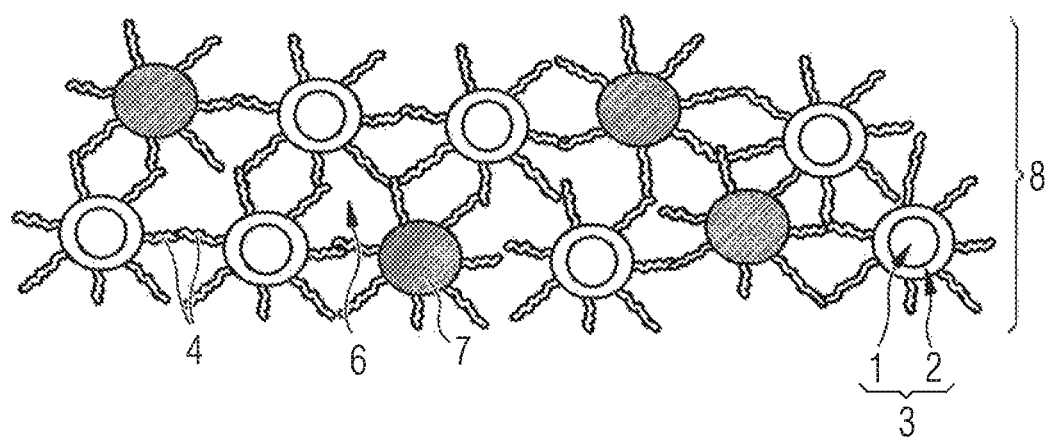
FIG. 6 shows a schematic illustration of a conversion layer according to one embodiment.

FIG. 6 shows a schematic illustration of a conversion layer 8. Compared to the conversion layer 5 of FIG. 4, the conversion layer 8 of FIG. 6 comprises encapsulated light-converting nanocrystals 3 and nonabsorbing particles 7 crosslinked by ligands 4. Nonabsorbing particles 7 can be used for intentional scattering of the primary radiation. Since a part of the primary radiation may pass through the ligands 4 and the voids 6, the addition of nonabsorbing particles 7 in the conversion layer 8 can reduce leaking of primary radiation through the conversion layer 8. This can improve the light absorption in the conversion layer 8 since the photons of the primary radiation may be distributed in such a way that the light-converting nanocrystals 1 can absorb a maximum of the primary radiation.

FIG. 7 shows a schematic illustration of a light-emitting device 10 comprising at least three emitters 11, 12, 13. Each emitter 11, 12, 13 has an edge length of at most 100 μm, in particular 5 μm, and is configured or designed to emit a primary radiation, in particular a blue primary radiation.

The first emitter 11 comprises a first conversion layer 14 arranged on the first emitter 11. The first conversion layer 14 comprises first light-converting nanocrystals 15. The first light-converting nanocrystals 15 are encapsulated by an encapsulation 2. The first encapsulated light-converting nanocrystals 16 are crosslinked by ligands 4, which are bonded to the surface of the first encapsulated light-converting nanocrystals 16. In particular, the first light-converting nanocrystals 15 are configured or designed to convert primary radiation in green radiation.

The second emitter 12 comprises a second conversion layer 17 arranged on the second emitter 12. The second conversion layer 17 comprises second light-converting nanocrystals 18. The second light-converting nanocrystals 18 are encapsulated by an encapsulation 2. The second encapsulated light-converting nanocrystals 19 are crosslinked by ligands 4, which are bonded to the surface of the second encapsulated light-converting nanocrystals 19. In particular, the second light-converting nanocrystals 18 are configured or designed to convert primary radiation in red radiation.

The third emitter 13 is free of a conversion element and is configured or designed to emit primary radiation, in particular blue primary radiation.

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. A conversion layer comprising:
   light-converting nanocrystals;
   an encapsulation surrounding the light-converting nanocrystals; and
   ligands bonded to a surface of the encapsulation,
   wherein encapsulated light-converting nanocrystals are crosslinked by the ligands,
   wherein each light-converting nanocrystal is individually encapsulated,
   wherein each individual encapsulated light-converting nanocrystal has a finite size,
   wherein a ligand of a light-converting nanocrystal is joined together with a ligand of an adjacent light-converting nanocrystal by a direct covalent bond, and
   wherein the encapsulation comprises a dielectric transparent oxide.

2. The conversion layer according to claim 1, wherein the conversion layer is free of a matrix material.

3. The conversion layer according to claim 1, wherein the conversion layer comprises voids between the encapsulated light-converting nanocrystals.

4. The conversion layer according to claim 1, wherein the conversion layer comprises non-absorbing particles.

5. The conversion layer according to claim 4, wherein the ligands are bonded to a surface of the non-absorbing particles, and wherein the light-converting nanocrystals and the non-absorbing particles are crosslinked by the ligands.

6. The conversion layer according to claim 1, wherein the conversion layer is photostructurable.

7. The conversion layer according to claim 1, wherein the ligands comprise an anchor group, a spacer group and a terminal group.

8. The conversion layer according to claim 7, wherein the anchor group is bonded to a surface of the encapsulated light-converting nanocrystals and/or non-absorbing particles with covalent, dative or ionic bonds.

9. The conversion layer according to claim 7, wherein the anchor group comprises Si and is covalently bonded to the surface of the encapsulated light-converting nanocrystals.

10. The conversion layer according to claim 7, wherein the terminal group comprises photosensitive functional groups.

11. The conversion layer according to claim 1, wherein the nanocrystals are composed of atoms in a single- or polycrystalline arrangement.

12. A light-emitting device comprising:
    a plurality of emitters, each emitter configured to emit electromagnetic radiation of a first wavelength range; and
    a conversion layer covering at least some of the emitters,
    wherein the conversion layer is configured to convert the electromagnetic radiation into electromagnetic radiation of another wavelength range,
    wherein the conversion layer comprises:
      light-converting nanocrystals,
      an encapsulation surrounding the light-converting nanocrystals, and
      ligands bonded to a surface of the encapsulation,
      wherein encapsulated light-converting nanocrystals are crosslinked by the ligands,
      wherein the encapsulation comprises a dielectric transparent oxide,
      wherein each light-converting nanocrystal is individually encapsulated,
      wherein each individual encapsulated light-converting nanocrystal has a finite size,
      wherein a ligand of a light-converting nanocrystal is joined together with a ligand of an adjacent light-converting nanocrystal by a direct covalent bond, and
    wherein the conversion layer is free of a matrix material.

13. The light-emitting device according to claim 12, wherein the conversion layer comprises a first conversion layer and a second conversion layer, wherein at least some of the emitters are covered with at least the first conversion layer or the second conversion layer, and wherein the at least first or second conversion layer differs in the light-converting nanocrystals and/or the ligands.

14. The light-emitting device according to claim 12,
    wherein the plurality of emitters are at least three emitters,
    wherein the conversion layer comprises a first conversion layer arranged at a first emitter of the emitters, the first conversion layer being configured to convert the radiation of the first wavelength range into radiation of a second wavelength range,
    wherein the conversion layer comprises a second conversion layer arranged at a second emitter of the emitters, the second conversion layer being configured to convert the radiation of the first wavelength range into radiation of a third wavelength range, and
    wherein a third emitter of the emitters is free of a conversion layer, or wherein the conversion layer comprises a third conversion layer arranged at the third emitter of the emitters, the third conversion layer being configured to convert the radiation of the first wavelength range into radiation of a fourth wavelength range.

15. A method for producing a conversion layer on a substrate, the method comprising:
providing the substrate;
applying an initial layer to the substrate, wherein the initial layer is photostructurable and comprises light-converting nanocrystals comprising an encapsulation and ligands bonded to a surface of the encapsulation, wherein each light-converting nanocrystal is individually encapsulated, and wherein each individual encapsulated light-converting nanocrystal has a finite size;
selectively exposing the initial layer to radiation to generate a pattern of exposed and unexposed areas of the initial layer, wherein the ligands in the initial layer are crosslinked while selectively exposing the initial layer to the radiation, or wherein crosslinked ligands in the initial layer are solubilized while selectively exposing the initial layer to the radiation; and
removing either the exposed areas or the unexposed areas of the initial layer.

16. The method according to claim 15, wherein the substrate comprises at least one light-emitting diode.

17. The method according to claim 15, wherein the initial layer is selectively exposed to radiation using a laser.

18. The method according to claim 15, wherein the ligands in the initial layer are crosslinked while selectively exposing the initial layer to the radiation.

19. The method according to claim 15, wherein crosslinked ligands are solubilized while selectively exposing the initial layer to the radiation.

20. The method according to claim 15, further comprising:
aligning a mask for generating the pattern of the exposed and unexposed areas on the initial layer prior to selectively exposing the initial layer to the radiation; and
removing the mask after selectively exposing the initial layer to the radiation.

* * * * *